(12) United States Patent  
Shimada et al.

(10) Patent No.: US 7,224,059 B2  
(45) Date of Patent: May 29, 2007

(54) METHOD AND APPARATUS FOR THERMO-ELECTRIC COOLING

(75) Inventors: Ryo Shimada, Tsukuba (JP); Shinichi Sakamoto, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 443 days.

(21) Appl. No.: 10/688,950

(22) Filed: Oct. 21, 2003

(65) Prior Publication Data

US 2005/0085075 A1    Apr. 21, 2005

(51) Int. Cl.
*H01L 23/34* (2006.01)

(52) U.S. Cl. .................. 257/712; 257/714; 257/716; 257/930; 257/E23.082

(58) Field of Classification Search .......... 257/712, 257/714, 716, 930  
See application file for complete search history.

(56) References Cited

U.S. PATENT DOCUMENTS

| | | | |
|---|---|---|---|
| 5,724,818 A * | 3/1998 | Iwata et al. ............. 62/3.7 |
| 6,222,113 B1 * | 4/2001 | Ghoshal ................ 136/201 |
| 6,408,937 B1 * | 6/2002 | Roy ................... 165/104.33 |
| 6,586,835 B1 | 7/2003 | Ahn et al. |
| 6,588,217 B2 | 7/2003 | Ghoshal |
| 6,613,602 B2 | 9/2003 | Cooper et al. |
| 6,614,109 B2 * | 9/2003 | Cordes et al. .............. 257/712 |
| 6,727,423 B2 | 4/2004 | Tauchi et al. |
| 6,787,896 B1 | 9/2004 | Petty-Weeks |
| 6,942,018 B2 * | 9/2005 | Goodson et al. ........... 165/80.4 |
| 6,981,380 B2 | 1/2006 | Chrysler et al. |

* cited by examiner

*Primary Examiner*—Andy Huynh  
*Assistant Examiner*—Dao H. Nguyen  
(74) *Attorney, Agent, or Firm*—Pearl Cohen Zedek Latzer, LLP

(57) ABSTRACT

Embodiments of the present invention provide a method, apparatus and system for absorbing heat from an active side of a die by a plurality of cold conductive elements embedded in said die, and releasing said absorbed heat by a plurality of hot conductive elements embedded in a substrate connected to said die.

18 Claims, 2 Drawing Sheets

METHOD AND APPARATUS FOR THERMO-ELECTRIC COOLING

BACKGROUND OF THE INVENTION

A die, e.g., a semiconductor die, may produce heat during its operation. The heat may be produced by an active side of the die. A cooling device may be used to reduce the temperature of the die during operation, e.g., such that the temperature of the die does not exceed a pre-defined maximum temperature limit.

Conventional cooling devices, for example, a heat sink in contact with a back side of the die and cooled, e.g., by a fan, may be used to reduce the temperature of the active side by removing heat from the backside of the die. In such devices, the location in which the heat is removed, e.g. the backside, is different than the location in which the heat is produced, e.g., the active side. Thus, due to the thermal resistance of the die and/or of any other material layers which may be located between the die and the heat sink, e.g., a Thermal insulating Material (TIM) and/or an Integral Heat Spreader (IHS), the cooling device located on the backside of the die may not efficiently remove the heat produced by the active side. As a result, the temperature of the active side may be higher than ambient temperature.

Some cooling devices implement a Thermo-Electric Converter (TEC) located relatively close to the active side of the die, e.g., connected to the die or to a substrate connected to the die, which is connected to the active side of the die. The TEC may have a cold section and a hot section. The cold section may absorb the heat produced by the active side of the die and the hot section may release the heat. However, the heat released by the hot section may increase the heat of the cold section, since both sections are located either in the substrate or in the die, which have a relatively low thermal resistance. Thus, these devices may not effectively remove the heat produced by the active side.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanying drawings in which:

Figure 1:
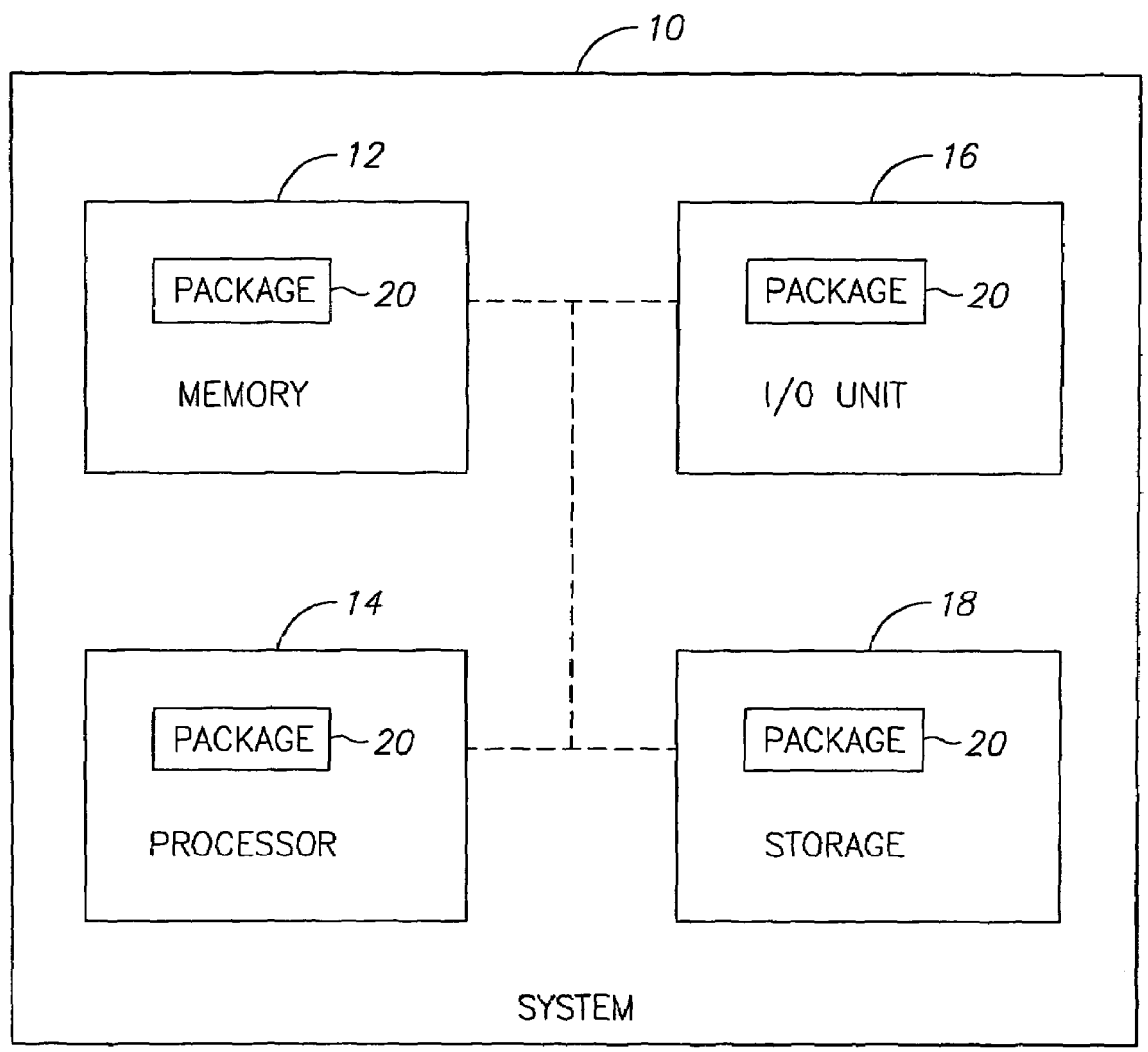
FIG. 1 is a schematic illustration of a computer system in accordance with some exemplary embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Reference is made to FIG. 1, which schematically illustrates a computer system 10 according to some exemplary embodiments of the present invention.

According to some exemplary embodiments, system 10 may include one or more memories 12, such as, for example, random access memories (RAMs), dynamic random access memories (DRAMs), read only memories (ROMs), and/or other memories, one or more processors 14, such as, for example, CPUs or other processors, and other units such as, for example, one or more input/output (I/O) units 16, one or more mass storage units 18 such as, for example, hard disk drives, compact disk drives, floppy disk drives, or other mass storage units, and possibly other units, as are known in the art. One or more of units 12, 14, 16 and/or 18 may include one or more semiconductor device, e.g., chip, packages 20, as described in detail below. Packages 20 may perform various functions, as is known in the art for packaged devices or integrated circuits, such as, for example, processing, calculating, I/O, storage or detecting. According to some embodiments, system 10 may include one or more devices which may not include a semiconductor packge.

Figure 2:
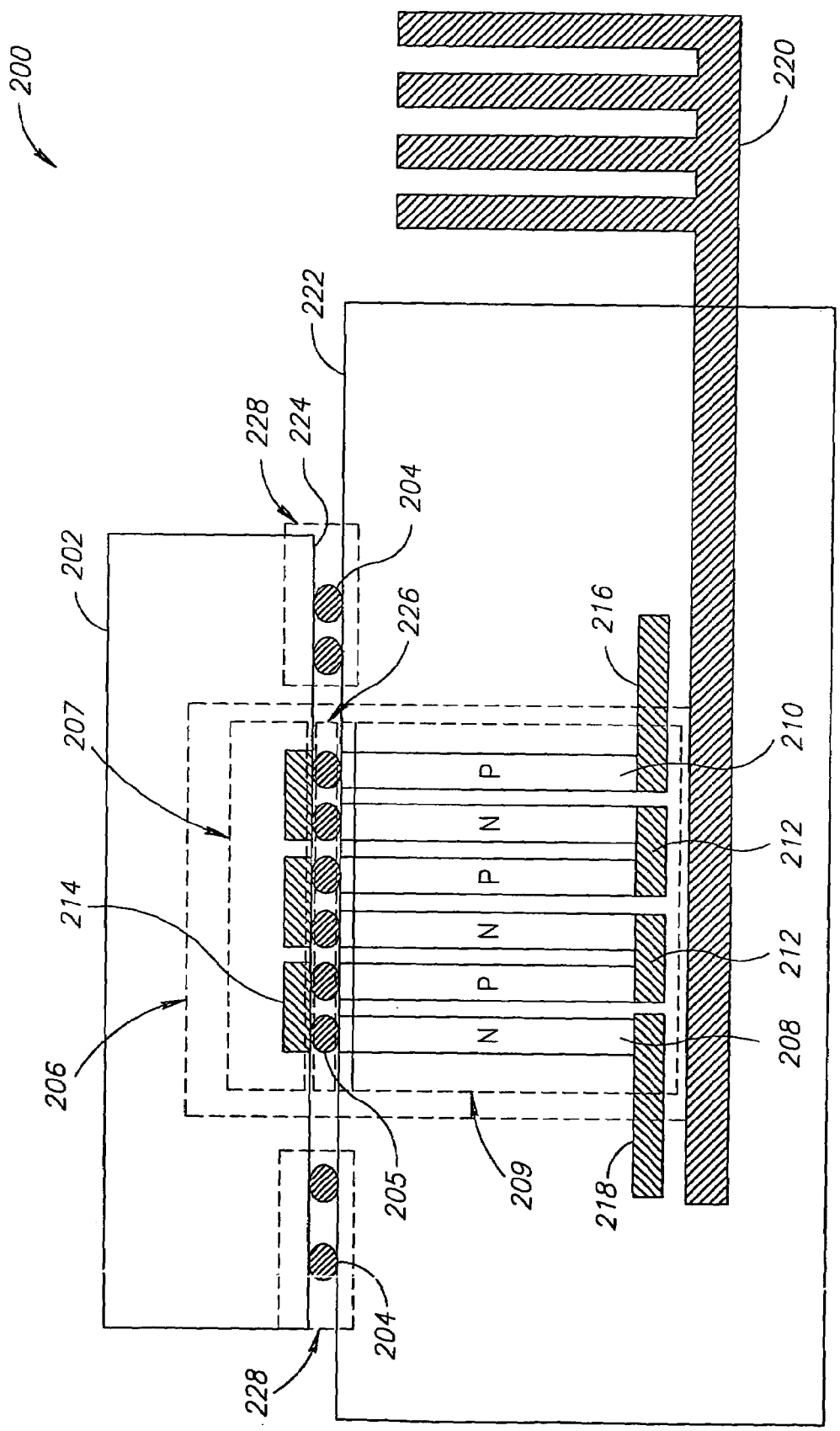
FIG. 2 is a schematic illustration of a cutaway view of a semiconductor device package in accordance with some exemplary embodiments of the present invention.

Reference is made to FIG. 2, which schematically illustrates a cutaway view of a semiconductor device package 200 in accordance with some exemplary embodiments of the present invention.

According to some embodiments of the invention, package 200 may include a die 202, which may be a semiconductor die. Die 202 may be adapted to perform functionality of, for example, processing, calculating, I/O operations, memory or data storage, the detection of substances, electromagnetic radiation or other phenomena, as are known in the art. Die 202 may include electronic components such as, for example, transistors, and may be fabricated using, for example, silicon and/or other substances. For example, die 202 may form part of a processor, a central processing unit (CPU), a memory, I/O unit, a detector, a transmitter, a signal processor, or a math co-processor. Die 202 may perform other functions or be part of other units. More than one die may be included in a package, as is known in the art. Die 202 may have an active side 224, which may include one or more semiconductor circuits, as is known in the art.

According to some exemplary embodiments, a set 228 of contacts 204, referred to herein as "bumps", may connect between one or more of the circuits of active side 224 and a substrate 222. For example, bumps 204 may be formed of a suitable electrical conductive material, e.g., copper, or a solder, as is known in the art. For example, substrate 222 may be adapted to electrically connect between die 202 and a motherboard (not shown), as is known in the art. Substrate 222 may be formed of an electric insulating material, e.g., a Poly-phenylene Ether (PPE) resin, and may include one or more electrical connections, as is known in the art.

According to embodiments of the invention, package 200 may also include an integrated Thermo-Electric Converter (TEC) configuration 206 to directly modify the temperature of one or more areas of active side 224, as described below. Configuration 206 may include a first TEC section 207 embedded in die 202, e.g., on active side 224, and a second TEC section 209 embedded in substrate 222, as described below. Configuration 206 may also include a set 226 of contacts, e.g., bumps, 205 connecting section 207 to section 209, as described below.

According to embodiments of the invention, section 209 may include a negative terminal 216, a positive terminal 218, a plurality of hot conductive elements 212 and a plurality of P-type TEC elements 210 and N-type elements 208 embedded in substrate 222, as described below. Elements 212 may be formed of conductive material, as is known in the art, such as, for example, copper. Elements 208 may include any suitable N-type elements, i.e., elements having negative charge carriers (electrons), as are known in the art, for example, elements 208 may include semiconductors, e.g., formed of $Bi_2Te_3$ with Selenium. Elements 210 may include any suitable P-type elements, i.e., elements having positive charge carriers (holes), as are known in the art, for example, elements 210 may include semiconductors, e.g., formed of $Bi_2Te_3$ with Antimony. According to some exemplary embodiments, elements 210 and 208 may have a width of between 1 µm and 5000 µm, for example, 200 µm; a length of between 1 µm and 5000 µm, for example, 200 µm; and a height of between 10 µm and 5000 µm, for example, 500 µm. Elements 208, 210 and 212 may be electrically separated from the electrical connections embedded in substrate 222, e.g., by the insulating material of the substrate, and/or by a thin electrical insulating layer (not shown), which may be formed of, for example, a PPE resin, a BT resin, as are known in the art, or any other suitable electrically insulating material.

According to embodiments of the invention, section 207 may include a plurality of hot conductive elements 214 embedded in die 202, e.g. on active side 224. Elements 214 may be formed of conductive material, as is known in the art, such as, for example, copper. Elements 214 may be electrically separated from circuits of die 202 by a thin electrical insulating layer (not shown), which may be formed of, for example, SiN, $SiO_2$, or any other suitable electrically insulating material.

According to embodiments of the invention bumps 205 may be adapted to transfer electrical power from elements 208 or 210 to elements 214, as described below. For, example, bumps 205 may be formed of a suitable electrical conductive material, e.g., copper, or a solder.

It may be appreciated by those skilled in the art that, according to some embodiments of the invention, bumps 204 and 205 may have a similar structure and/or may be formed of similar material. According to some of these embodiments, bumps 204 and 205 may be part of one bump array connected to active side 224, such that bumps 205 are electrically isolated from the circuits of active side 224.

According to some exemplary embodiments, TEC configuration 206 may also include diffusion barrier layers (not shown) separating elements 208 and 210 from elements 212 and from bumps 205. The diffusion barrier layers may be formed of any suitable material, e.g., Ti, Cr or NiV, to prevent diffusion of elements 208 and/or elements 210 into elements 212 and/or bumps 205.

According to exemplary embodiments of the invention, elements 208, 210, 212 and 214, and bumps 205 may be connected, e.g., in a "N-type-bump-top conductor-bump-P-type-bottom conductor" order, to form a continuous electrical connection between terminal 216 and terminal 218. Elements 208 and 210 may be arranged intermittently, such that each element 212 is associated with one P-type element 210 and one N-type element 208, and each element 214 is associated, via bumps 205, with one P-type element 210 and one N-type element 208. According to some exemplary embodiments, terminals 216 and 218 may be electrically connected, e.g., by silicon vias or wires as are known in the art, to one or more of bumps 204 which may provide power to the circuits of active side 224 such that electrical power may be transferred to TEC configuration 206. According to other exemplary embodiments, terminals 216 and 218 may be electrically connected, e.g., by silicon-vias or wires as are known in the art, to an outer power supply.

According to some embodiments of the invention, TEC configuration 206 may be implemented as a Peltier device, as is known in the art. Thus, TEC configuration 206 may be implemented as a cooler, i.e., heat may be absorbed from active side 224 by cold elements 214 and released by hot elements 212, when terminal 216 is associated with a negative voltage potential, and terminal 218 is associated with a positive voltage potential. Thus, TEC configuration 206 may be implemented to directly modify the temperature of one or more areas of active side 224, since cold elements 214 are located on active side 224 or relatively close to active side 224. For example, the location of configuration 206 may be predetermined according to an area of active side 204 which may produce a relatively high temperature ("hot spots").

According to some exemplary embodiments of the invention, package 200 may be connected to an external heat sink 220, as is known in the art. The heat released by elements 212 may be conveyed by heat sink 220 from substrate 222 to the environment. It may be appreciated by those skilled in the art that other suitable methods to remove from substrate 222 the heat released from elements 212. For example, a heat sink may be implemented to convey the heat to the mother-board (not shown), which may be connected to substrate 222, as is known in the art.

It will be appreciated by those skilled in the art that the heat released by hot elements 212 may substantially not affect the temperature of cold elements 214, since hot elements 212 are embedded in substrate 222 and cold elements 214 are embedded in die 202. Furthermore, TEC configuration 206 may efficiently remove heat produced by active side 224 or desired areas thereof, since elements 214 are located on the active side or relatively close to the active side. Thus, it will be appreciated by those skilled in the art that the TEC configuration according to embodiments of the invention, may be implemented to reduce the temperature of an active side of a die or of desired portions of the active side more efficiently in comparison to other cooling devices known in the art. For example, the TEC configuration according to embodiments of the invention may be implemented to reduce the temperature of the active side to a temperature equal to or lower than ambient temperature.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. An apparatus of cooling one or more portions of a die, the apparatus comprising:
    a thermo-electric converter configuration having a first section embedded in said die and a second section embedded in a substrate connected to said die, wherein said first section comprises a plurality of cold conductive elements embedded in an active side of said die to absorb beat from said active side.

2. The apparatus of claim 1, wherein said second section comprises a plurality of hot conductive elements to release said absorbed heat.

3. The apparatus of claim 2, wherein said configuration comprises a plurality of contacts to electrically connect said first section to said second section.

4. The apparatus of claim 3, wherein one or more of said cold conductive elements is connected to one or more of said contacts.

5. The apparatus of claim 4, wherein said second section comprises a plurality of p-type elements and n-type elements connected to said hot conductive elements and to said contacts to form a substantially continuous electric connection between a positive terminal and a negative terminal of said thermo electric converter.

6. The apparatus of claim 1, comprising a heat sink to convey heat out of said second section.

7. The apparatus of claim 1, wherein said plurality of p-type elements and n-type elements are embedded in said substrate.

8. A semiconductor device package, the package comprising:
   a die; and
   a thermo-electric converter configuration having a first section embedded in said die and a second section embedded in a substrate connected to said die, wherein said first section comprises a plurality of cold conductive elements embedded in an active side of said die to absorb heat from said active side.

9. The semiconductor device package of claim 8, wherein said second section comprises a plurality of hot conductive elements to release said absorbed heat.

10. The semiconductor device package of claim 9, wherein said configuration comprises a plurality of contacts to electrically connect said first section to said second section.

11. The semiconductor device package of claim 10, wherein one or more of said cold conductive elements is connected to one or more of said contacts.

12. The semiconductor device package of claim 11, wherein said second section comprises a plurality of p-type elements and n-type elements connected to said hot conductive elements and to said contacts to form a substantially continuous electric connection between a positive terminal and a negative terminal of said thermo electric converter.

13. The semiconductor device package of claim 8 comprising a heat sink to convey heat out of said second section.

14. A method of cooling one or more portions of a die, the method comprising:
   absorbing heat from an active side of said die by a plurality of cold conductive elements embedded in said die; and
   releasing said absorbed heat by a plurality of hot conductive elements embedded in a substrate connected to said die.

15. The method of claim 14 comprising conveying said released heat out of said substrate.

16. The method of claim 15, wherein conveying said released heat comprises using a heat sink associated with said substrate.

17. The method of claim 14 comprising electrically connecting said hot conductive elements to said cold conductive elements.

18. The method of claim 17, wherein electrically connecting comprises using a plurality of contacts and a plurality of n-type elements and p-type elements.

* * * * *